US011930632B2

(12) United States Patent
Liu

(10) Patent No.: US 11,930,632 B2
(45) Date of Patent: Mar. 12, 2024

(54) GATE STRUCTURE AND MANUFACTURING METHOD THEREOF

(71) Applicant: CHANGXIN MEMORY TECHNOLOGIES, INC., Anhui (CN)

(72) Inventor: Chih-Cheng Liu, Anhui (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 196 days.

(21) Appl. No.: 17/594,491

(22) PCT Filed: Jun. 29, 2021

(86) PCT No.: PCT/CN2021/103228
§ 371 (c)(1),
(2) Date: Oct. 19, 2021

(87) PCT Pub. No.: WO2022/100105
PCT Pub. Date: May 19, 2022

(65) Prior Publication Data
US 2022/0415899 A1     Dec. 29, 2022

(30) Foreign Application Priority Data

Nov. 13, 2020   (CN) .......................... 202011265365.9

(51) Int. Cl.
*H10B 12/00*     (2023.01)
(52) U.S. Cl.
CPC .......... *H10B 12/34* (2023.02); *H10B 12/053* (2023.02); *H10B 12/488* (2023.02)
(58) Field of Classification Search
CPC . H10B 12/34; H10B 12/053; H01L 29/42356; H01L 29/4236; H01L 29/42336; H01L 29/1037
See application file for complete search history.

(56) References Cited

U.S. PATENT DOCUMENTS

| 7,777,266 B2 | 8/2010 | Baars et al. |
| 9,634,109 B2 | 4/2017 | Oh et al. |

(Continued)

FOREIGN PATENT DOCUMENTS

| CN | 104810390 A | 7/2015 |
| CN | 104810390 B | 7/2019 |

(Continued)

OTHER PUBLICATIONS

International Search Report cited in PCT/CN2021/103228, dated Sep. 28, 2021, 8 pages.

*Primary Examiner* — Nicholas J Tobergte
*Assistant Examiner* — William H Anderson
(74) *Attorney, Agent, or Firm* — Cooper Legal Group, LLC

(57) ABSTRACT

Embodiments of the present disclosure provide a semiconductor structure and a manufacturing method thereof. According to embodiments of the present disclosure, a height of the work function layer, especially a height of the second portion of the work function layer, is significantly increased, and a height of the first gate material layer is significantly reduced, so that the height ratio of the second portion of the work function layer to the first gate material layer to the second gate material layer is maintained at 3 to 8:1 to 1.5:1; therefore, it can be ensured that the work function of the WL groove filling material layer of the recessed gate structure with a small WL width will be significantly increased, thereby greatly weakening the row hammer effect at the bottom of the WL groove and obviously reducing the GIDL effect at the upper part of the WL groove.

14 Claims, 11 Drawing Sheets

(56) References Cited

U.S. PATENT DOCUMENTS

| | | | |
|---|---|---|---|
| 2015/0214313 A1 | 7/2015 | Oh et al. | |
| 2015/0349073 A1* | 12/2015 | Kang | H01L 29/66621 |
| | | | 257/330 |
| 2016/0172488 A1* | 6/2016 | Oh | H10B 63/30 |
| | | | 257/330 |
| 2017/0069632 A1 | 3/2017 | Wu | |
| 2017/0365608 A1* | 12/2017 | Lee | H01L 29/517 |
| 2019/0259839 A1* | 8/2019 | Ryu | H01L 29/66734 |
| 2021/0082767 A1* | 3/2021 | Kim | H01L 21/823418 |
| 2021/0327882 A1* | 10/2021 | Liao | H10B 12/488 |

FOREIGN PATENT DOCUMENTS

| | | |
|---|---|---|
| CN | 110957318 A | 4/2020 |
| CN | 111403388 A | 7/2020 |

\* cited by examiner

GATE STRUCTURE AND MANUFACTURING METHOD THEREOF

CROSS-REFERENCE TO RELATED APPLICATIONS

The present disclosure is based on Chinese Patent Application No. 202011265365.9, filed on Nov. 13, 2020, the entire contents of which are hereby incorporated by reference into the present disclosure.

TECHNICAL FIELD

The present disclosure relates to the field of semiconductor technologies, and in particular to a semiconductor structure and a manufacturing method thereof.

BACKGROUND

A WL (Word Line) pattern of a DRAM (Dynamic Random Access Memory) is composed of an SADP (Self-aligned Double Patterning) process and a recessed gate structure of an RCAT (Recess Channel Array Transistor). As the dimension of a memory shrinks, the WL width is getting smaller; if the existing recessed gate structure is still used in case of a small WL width, technical problems such as obvious reduction in a work function of a WL groove filling material layer, significant increase in the row hammer effect at a bottom of a WL groove, and obvious increase in the GIDL (Gate-Induced Drain Leakage) effect at an upper part of the WL groove will be caused.

SUMMARY

Embodiments of the present disclosure provide a semiconductor structure and a manufacturing method thereof, which helps to improve the technical problems in the prior art, such as obvious reduction in the work function of the WL groove filling material layer, significant increase in the row hammer effect at the bottom of the WL groove, and obvious increase in the GIDL effect at the upper part of the WL groove, caused as the dimension of the memory shrinks and the WL width is getting smaller.

In order to achieve the above objective and other related objectives, embodiments of the present disclosure discloses a semiconductor structure, including:
a substrate; isolation regions formed in the substrate; active regions formed in the substrate and defined by the isolation regions; gate structures formed in the substrate and arranged alternately with the isolation regions and the active regions, the gate structure including a gate groove formed in the substrate;
a gate dielectric layer formed on an inner surface of the gate groove;
a work function layer formed on the gate dielectric layer and in the gate groove, the work function layer including a first portion of the work function layer that is lower than a top surface of the active region and a second portion of the work function layer that is distributed along a direction substantially perpendicular to a bottom of the gate groove, a first groove being formed between the first portion of the work function layer and the second portion of the work function layer;
a first gate material layer formed on an inner surface of the work function layer and filling up the first groove; and
a second gate material layer formed on a top surface of the work function layer, a top surface of the first gate material layer and a surface of the gate dielectric layer, the second gate material layer being lower than the top surface of the active region;
a height ratio of the second portion of the work function layer to the first gate material layer to the second gate material layer being 3-8:1-1.5:1.

According to embodiments of the present disclosure, a height of the work function layer, especially a height of the second portion of the work function layer, is significantly increased, and a height of the first gate material layer is significantly reduced, so that the height ratio of the second portion of the work function layer to the first gate material layer to the second gate material layer is maintained at 3-8:1-1.5:1; therefore, it can be ensured that the work function of the WL groove filling material layer of the recessed gate structure will be significantly increased, thereby greatly weakening the row hammer effect at the bottom of the WL groove and obviously reducing the GIDL effect at the upper part of the WL groove.

Embodiments of the present disclosure further provide a manufacturing method of the semiconductor structure, including:
providing an initial structure, the initial structure including a substrate, as well as active regions and isolation regions which are formed in the substrate, the isolation regions isolating the active regions;
etching the active regions and the isolation regions on the substrate to form gate grooves, the gate grooves being alternately arranged with the isolation regions and the active regions;
forming a gate dielectric layer on an inner surface of the gate groove;
forming a work function layer on the gate dielectric layer and in the gate groove, the work function layer including a first portion of the work function layer that is lower than a top surface of the active region and a second portion of the work function layer that is distributed along a direction substantially perpendicular to a bottom of the gate groove, a first groove being formed between the first portion of the work function layer and the second portion of the work function layer;
forming a first gate material layer on an inner surface of the work function layer, the first gate material layer filling up the first groove; and
forming a second gate material layer on a top surface of the work function layer, a top surface of the first gate material layer and a surface of the gate dielectric layer, the second gate material layer being lower than the top surface of the active region.

Embodiments of the present disclosure further provide a memory, including the semiconductor structure described in embodiments of the present disclosure.

The semiconductor structure disclosed in embodiments of the present disclosure, which helps to improve the technical problems in the prior art, such as obvious reduction in the work function of the WL groove filling material layer, significant increase in the row hammer effect at the bottom of the WL groove, and obvious increase in the GIDL effect at the upper part of the WL groove, caused as the dimension of the memory shrinks and the WL width is getting smaller According to embodiments of the present disclosure, a height of the work function layer in the WL groove filling material layer, especially a height of the second portion of the work function layer, is significantly increased, and a height of the first gate material layer is significantly reduced, so that the height ratio of the second portion of the work function layer to the first gate material layer to the second gate material layer is maintained at 3-8:1-1.5:1; therefore, it can be ensured that the work function of the WL groove filling material layer of the recessed gate structure will be significantly increased, thereby greatly weakening the row hammer effect at the bottom of the WL groove and obviously reducing the GIDL effect at the upper part of the WL groove.

BRIEF DESCRIPTION OF DRAWINGS

The specific features of the invention involved in the present disclosure are as shown in the appended claims, and some exemplary embodiments of the present disclosure are shown in the drawings and are used to explain the present disclosure together with the description. The characteristics and advantages of the invention involved in the present disclosure can be better understood by referring to the exemplary embodiments and the accompanying drawings described in detail below. A brief description of the drawings is as follows:

FIG. 7 is a corresponding cross-sectional diagram cut along M-M in FIG. 6.

DESCRIPTION OF EMBODIMENTS

Figure 1:
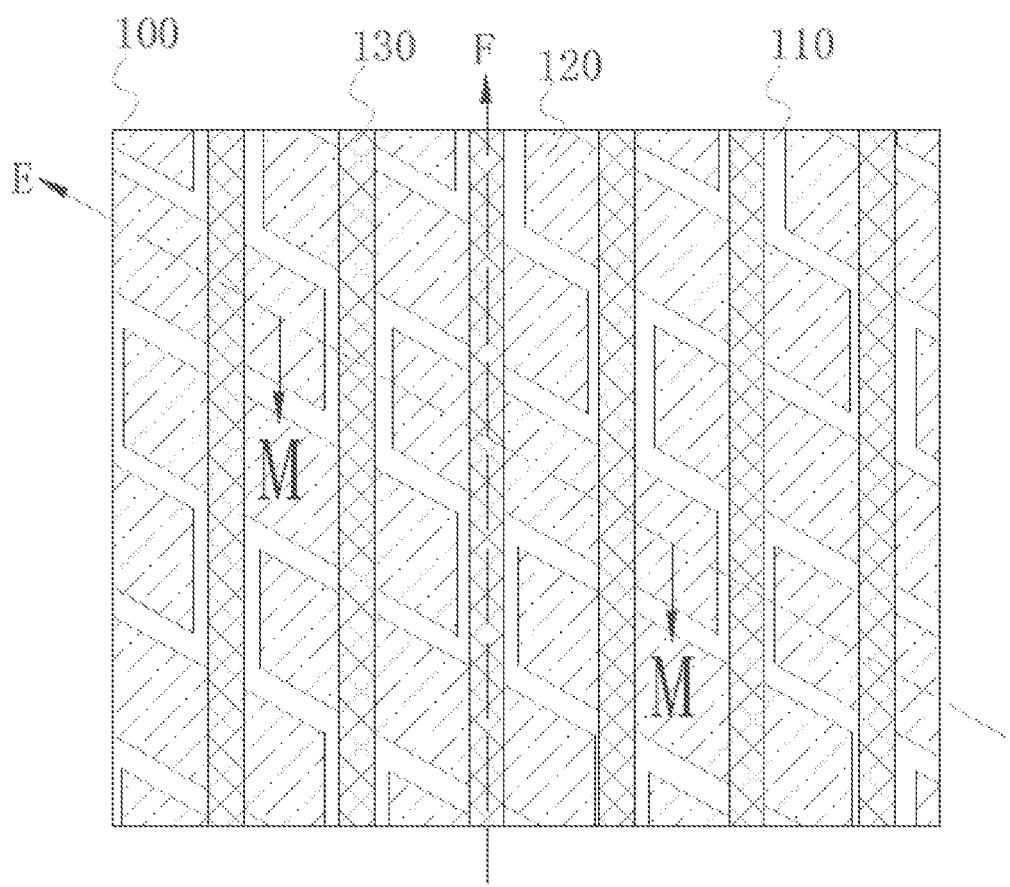
FIG. 1 is a schematic diagram of a semiconductor structure.

Embodiments of the present disclosure are described below as specific embodiments. Those skilled in the art may easily understand other advantages and effects of embodiments of the present disclosure from the contents disclosed herein.

The exemplary embodiments will now be described more fully with reference to the accompanying drawings. However, exemplary embodiments may be implemented in many forms and should not be construed as limited to embodiments set forth herein; on the contrary, these embodiments are provided so that the present disclosure become more comprehensive and complete and the concepts of the exemplary embodiments are conveyed to those skilled in the art. The same reference numerals in the drawings denote the same or similar structures, and thus their detailed descriptions will be omitted.

Although relative terms are used herein, such as "upper", "middle", "lower" or "top" and "bottom" to describe a relative relationship between one component and another component of icons, these terms are used herein only for convenience, for example, the directions of the examples described in the drawings. It is to be understood that when the apparatus of the icon is turned upside down, components described as "above" will become components described as "below". When a certain structure is "above" other structures, it likely means that a certain structure is integrally formed on other structures, or a certain structure is "directly" arranged on other structures, or a certain structure is "indirectly" arranged on other structures by means of another structure.

The term "the" is intended to mean that there exists one or more elements/constituent parts/etc. The terms "including" and "having" are intended to be inclusive and mean that there may be additional elements/constituent parts/etc. other than the listed elements/constituent parts/etc. The terms "first" and "second" are only used as markers and are not intended to limit the number of objects.

Figure 2:
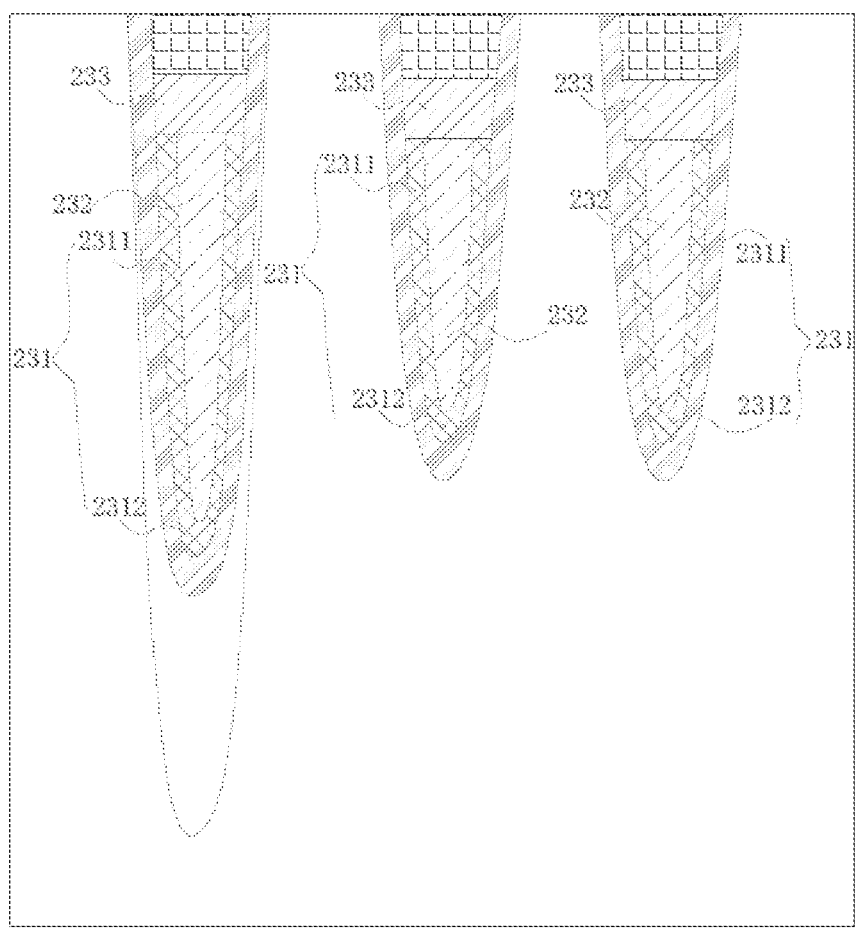
FIG. 2 is a corresponding cross-sectional diagram of a semiconductor structure in the prior art cut along M-M in FIG. 1.

Generally, the WL pattern of the DRAM includes an SADP process and a recessed gate structure of an RCAT. As shown in FIGS. 1 and 2, a WL material in an existing semiconductor structure is a first gate material layer 232, such as a W layer, with a work function layer 231 such as a Ti or TiN layer; wherein a height ratio of a second portion 2312 of the work function layer 231 to the first gate material layer 232 to a second gate material layer 233 is generally 0.1-1:10-30:1. For the WL of a regular dimension in a existing DRAM cell, a thickness of the first portion 2311 of the work function layer 231 such as a TiN layer is generally within a range of 1 nm-5 nm, and the height of the second portion 2312 of the work function layer 231 is generally within a range of 1 nm-7 nm; a thickness of the first gate material layer 232 such as a W layer is generally within a range of 10 nm-30 nm, and the height of the first gate material layer 232 is generally within a range of 20 nm-80 nm; a thickness of the second gate material layer 233 is generally within a range of 20 nm-40 nm, and the height of the second gate material layer 233 is generally within a range of 5 nm-30 nm. As the WL width decreases (generally within a range of 15 nm-30 nm), it is difficult to fill the WL groove (i.e., the gate groove) with the work function layer 231 and first gate material layer 232 of existing dimension; or, that is, the work function layer 231 and first gate material layer 232 of the existing dimension are used to fill the WL grooves to form the WL gate structure; for example, the work function layer 231 is configured as a TiN layer, the first gate material layer 232 is configured as a W layer, and the second gate material layer 233 is configured as a N+polysilicon layer; since the WF (Work Function) of the N+polysilicon layer is generally 4.02, the WF of TiN is 4.8, the WF of W is 4.55, and in a case of a small WL width, if the work function layer 231 and first gate material layer 232 of the existing dimension are used to fill the WL groove, the WF of the WL groove filling material layer will be significantly reduced, the row hammer effect at the bottom of the WL groove will be greatly increased, and the GIDL at the upper part of the WL groove will be increased obviously. Therefore, how to effectively solve the technical problems such as obvious reduction in the work function of the WL groove filling material layer, significant increase in the row hammer effect at the bottom of the WL groove, and obvious increase in the GIDL effect at the upper part of the WL groove, caused as the dimension of the memory shrinks and the WL width is getting smaller, is a problem urgently to be solved in the industry.

In view of the above-mentioned technical problems in the prior art, embodiments of the present disclosure discloses a semiconductor structure. By improving the existing grate structure, the technical problems such as obvious reduction in the work function of the WL groove filling material layer, significant increase in the row hammer effect at the bottom of the WL groove, and obvious increase in the GIDL effect at the upper part of the WL groove, caused as the dimension of the memory shrinks and the WL width is getting smaller, can be effectively solved.

Figure 3:
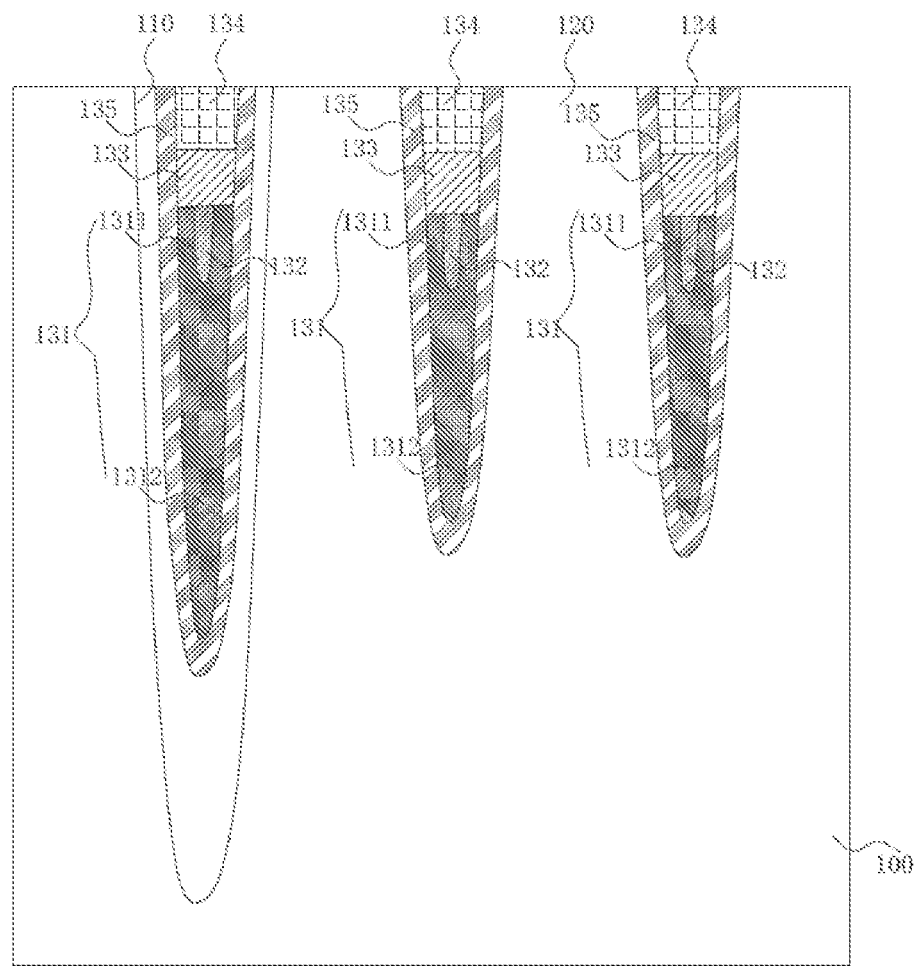
FIG. 3 is a corresponding cross-sectional diagram of a semiconductor structure of embodiments of the present disclosure cut along M-M in FIG. 1.

Referring to FIGS. 1 and 3, the semiconductor structure of embodiments of the present disclosure includes:

a substrate 100; isolation regions 110 formed in the substrate 100; active regions 120 formed in the substrate 100 and defined by the isolation regions 110; and gate structures 130 formed in the substrate 100 and arranged alternately with the isolation regions 110 and the active regions 120, wherein as shown in FIG. 1, the active region 120 may have a long axis in direction E, the gate structure 130, i.e., a WL structure, may be arranged along direction F, and the gate structure 130 includes a gate groove 140 formed in the substrate 100;

a gate dielectric layer 135 formed on an inner surface of the gate groove 140;

a work function layer 131 formed on the gate dielectric layer 135 and in the gate groove 140, the work function layer 131 including a first portion 1311 of the work function layer that is lower than a top surface of the active region 120 and a second portion 1312 of the work function layer that is distributed along a direction substantially perpendicular to a bottom of the gate groove 140, a first groove being formed between the first portion 1311 of the work function layer and the second portion 1312 of the work function layer;

a first gate material layer 132 formed on an inner surface of the work function layer 131 and filling up the first groove; and a second gate material layer 133 formed on a top surface of the work function layer 131, a top surface of the first gate material layer 132 and a surface of the gate dielectric layer 135, the second gate material layer 133 being lower than the top surface of the active region 120;

a height ratio of the second portion 1312 of the work function layer to the first gate material layer 132 to the second gate material layer 133 being 3-8:1-1.5:1.

According to embodiments of the present disclosure, a height of the work function layer 131, especially a height of the second portion 1312 of the work function layer, is significantly increased, and a height of the first gate material layer 132 is significantly reduced, so that the height ratio of the second portion 1312 of the work function layer to the first gate material layer 132 to the second gate material layer 133 is maintained at 3-8:1-1.5:1; therefore, it can be ensured that the work function of the WL groove filling material layer of the recessed gate structure will be significantly increased, thereby greatly weakening the row hammer effect at the bottom of the WL groove and obviously reducing the GIDL effect at the upper part of the WL groove.

In the improved semiconductor structure of embodiments of the present disclosure, only a gate of the work function layer 131 is at the bottom of the RCAT, only a multi-gate material layer including the work function layer 131 and the first gate material layer 132 is in the middle of the RCAT, and the second gate material layer 133 is at the top of the RCAT; in this way, the GIDL effect can be reduced.

Figure 4:
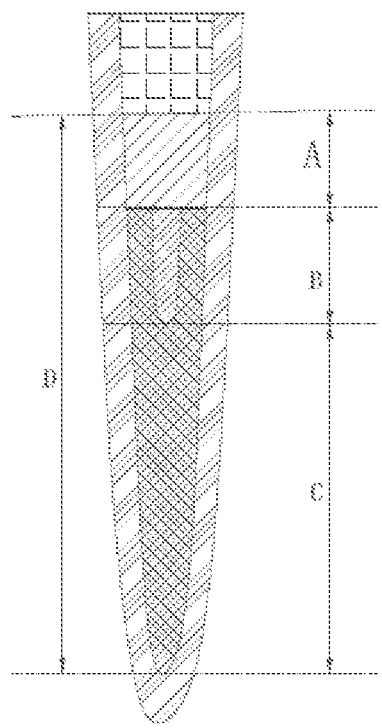
FIG. 4 is a voltage distribution diagram of a gate structure in a semiconductor structure of embodiments of the present disclosure.
Figure 5:
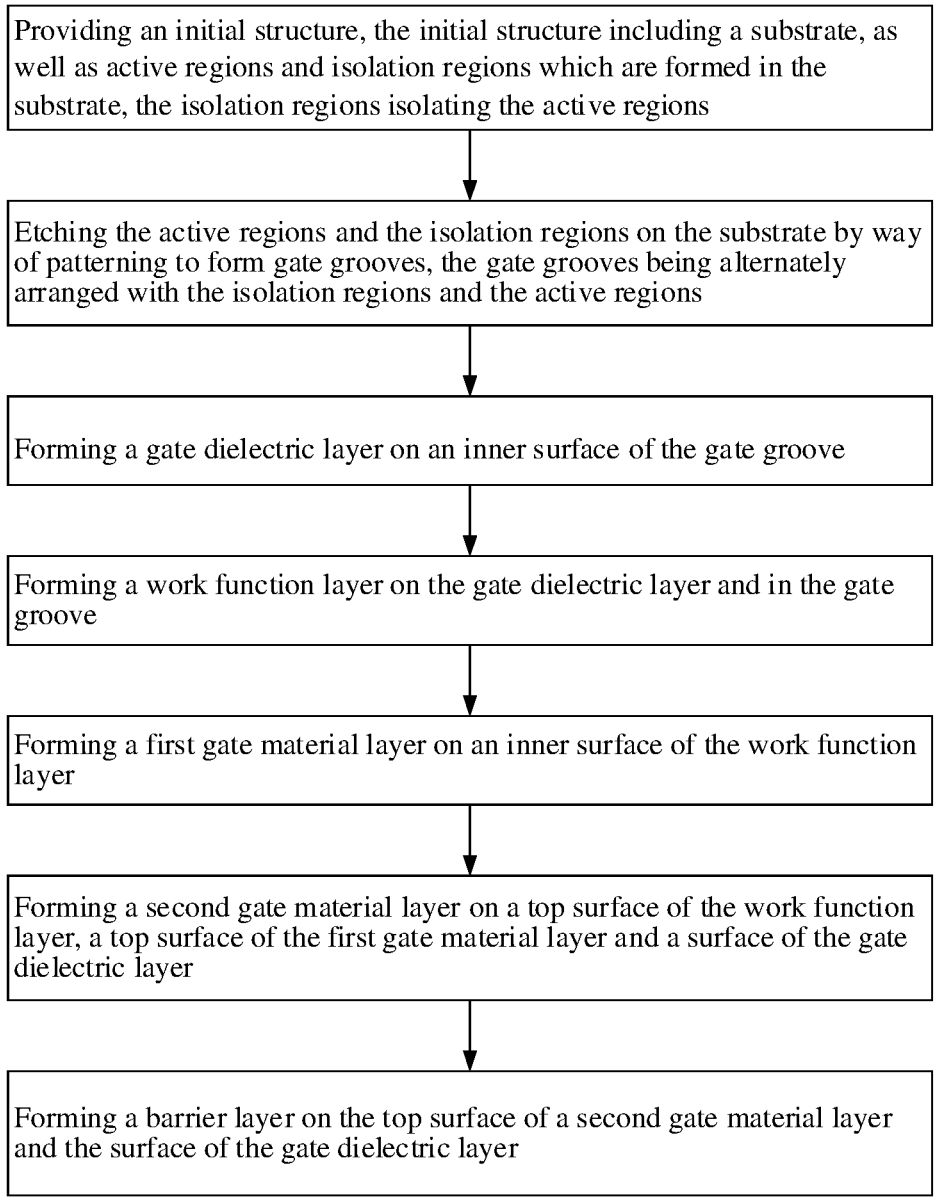
FIG. 5 is a schematic flow chart of a manufacturing method of a semiconductor structure of embodiments of the present disclosure.

In the improved semiconductor structure of embodiments of the present disclosure, the RCAT is formed as a triple-voltage (VT) RCAT, as shown in FIG. 4, including a low-VT region A at the top, a medium-VT region B in the middle, and a high-VT region C at the bottom; the high-VT region C at the bottom can reduce the impact of the row hammer effect of the passing WL; and the low-VT region A at the top can reduce the GIDL. A voltage gradient design (low voltage to high voltage) is adopted to reduce electric fields. The voltage of the low-VT region A at the top is denoted as A, the voltage of the middle-VT region B is denoted as B, the voltage of the bottom high-VT region C is denoted as C, and the sum of the triple voltages is denoted as D, that is, A+B+C=D, and then in the improved semiconductor structure of embodiments of the present disclosure, A+B<½D and B<¼D, which can reduce electric field leakage; C>½D, which is a length of a main channel for turning off current (Ioff).

In an embodiment, a ratio of the thickness of the first portion 1311 of the work function layer, the thickness of the first gate material layer 132 to the width of the gate groove 140 is 1-6:1-10:15-30.

In an embodiment, a width dimension (i.e., the WL width) of the gate groove 140 is within a range of 15 nm-30 nm.

In an embodiment, the height of the second portion 1312 of the work function layer is within a range of 30 nm-65 nm.

In an embodiment, the height of the first gate material layer 132 is within a range of 5 nm-15 nm.

In an embodiment, the height of the second gate material layer 133 is within a range of 5 nm-15 nm.

The height is a dimension in the direction substantially perpendicular to the bottom of the gate groove 140.

In an embodiment, the thickness of the gate dielectric layer 135 is within a range of 25 A-40 A (angstroms), which is specifically set according to the dimension (width or depth) of the gate groove 140; and the top surface of the gate dielectric layer 135 is flush with the surface of the substrate.

In an embodiment, the thickness of the first portion 1311 of the work function layer is within a range of 1 nm-6 nm.

In an embodiment, the thickness of the first gate material layer 132 is within a range of 1 nm-10 nm.

In an embodiment, the thickness of the second gate material layer 133 is substantially equivalent to the sum of two times the thickness of the first portion 1311 of the work function layer and the thickness of the first gate material layer 132.

The thickness is a dimension in a direction substantially perpendicular to a sidewall of the gate groove 140.

In an embodiment, the work function layer 131 can be configured as a titanium nitride (TiN) layer, a titanium (Ti) layer, a tantalum (Ta) layer, a tantalum nitride (TaN) layer, or the like. The work function layer 131 may serve as a metal gate (MG).

In an embodiment, a material of the first gate material layer 132 is different from that of the work function layer 131, and can be configured as a tungsten (W) layer, a cobalt (Co) layer, a nickel (Ni) layer, a tantalum (Ta) layer, a tantalum nitride (TaN) layer, a titanium (Ti) layer, a titanium nitride (TiN) layer, or the like.

In an embodiment, the WF of the second gate material layer 133 is less than the WF of the first gate material layer, and the second gate material layer 133 can be configured as a silicon germanium layer, a monocrystalline silicon layer, a doped-polysilicon (e.g., N+polysilicon) layer, or the like. N+polysilicon with a low work function is preferred, which can further reduce the GIDL effect.

In an embodiment, the gate dielectric layer 135 can be configured as an oxide layer, a silicon nitride layer, a high-K gate dielectric material layer, or the like.

In an embodiment, the gate structure 130 further includes a barrier layer 134 formed on a top surface of the second gate material layer 133 and at least flush with the surface of the substrate 100.

In an embodiment, the barrier layer 134 has an insulating effect, and is made of a material having an insulating effect. The barrier layer 134 can be configured as a silicon nitride (SiN) layer, a silicon oxynitride (SiON) layer, a silicon carbide nitride (SiCN) layer, or the like.

In one embodiment, the thickness or width of the barrier layer 134 is equivalent to the thickness of the second gate material layer 133.

The dimension of the gate dielectric layer 135 can be conventionally set according to the dimension of the gate groove 140. The dimension includes thickness and height.

In an embodiment, the gate structure 130 includes an APG (Active Passing Gate) arranged in the active region 120 and configured to control the on or off of the RCAT in the active region; and an FPG (Field Pass Gate), arranged in the isolation region 110 and configured to communicate the APGs in different active regions. Ideally, the gate structures of the isolation region 110 and the active region 120 are the same; however, in practice, since the isolation region 110 is generally made of an oxidized material and the active region 120 is generally made of a monocrystalline silicon material, the isolation region 110 and the active region 120 are different in etch rate ratio under the same etching process, resulting a large etching depth in a trench region, i.e., the isolation region 110.

In an embodiment, the height of the second portion 1312 of the work function layer in the APG is within a range of 30 nm-65 nm.

In an embodiment, the second portion 1312 of the work function layer in the FPG is slightly higher than the second portion 1312 of the work function layer in the APG.

In an embodiment, the substrate 100 may be configured as a P-type substrate or an N-type substrate.

In an embodiment, the isolation region 110 includes a shallow trench isolation region.

The manufacturing method of a semiconductor structure disclosed in embodiments of the present disclosure will be described in detail below with reference to FIG. 5 to FIG. 16. The method includes the following.

Figure 6:
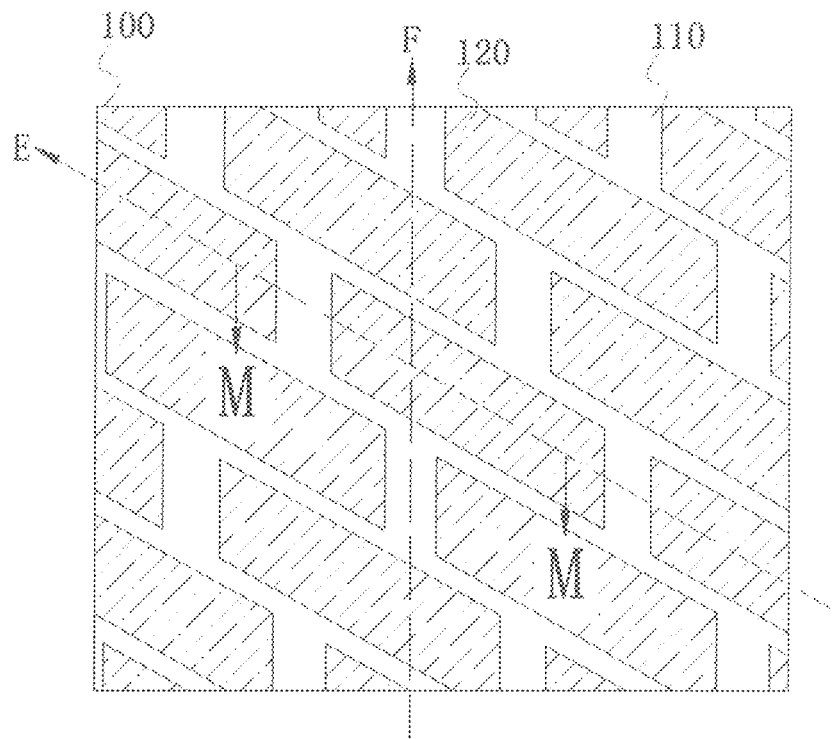
FIGS. 6 to 16 are schematic diagrams of structural changes of a semiconductor structure manufactured according to steps in FIG. 5; where
Figure 7:
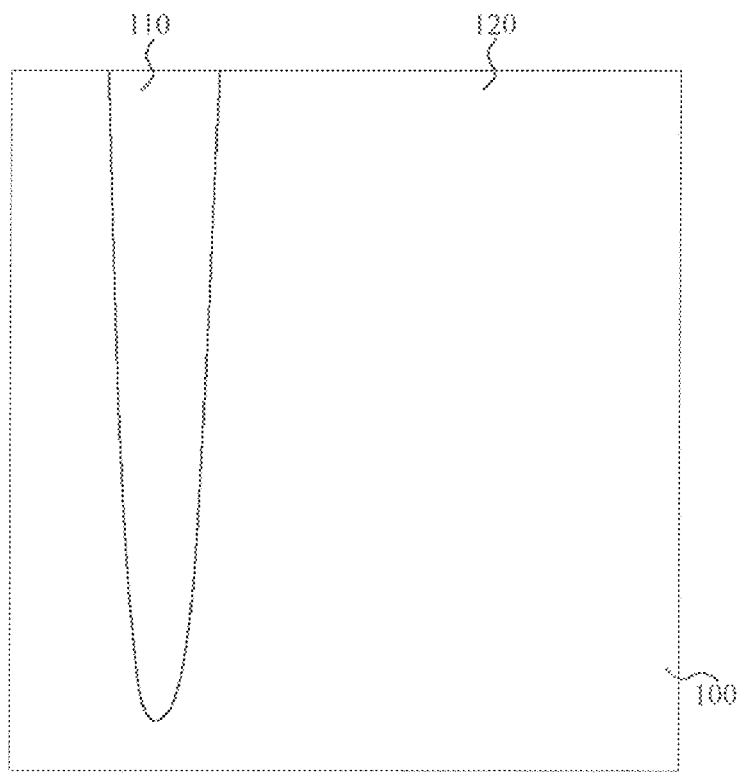

As shown FIGS. 6 and 7, an initial structure is provided; the initial structure includes a substrate 100, as well as active regions 120 and isolation regions 110 which are formed in the substrate 100, and the isolation regions 110 isolate the active regions 120.

Figure 8:
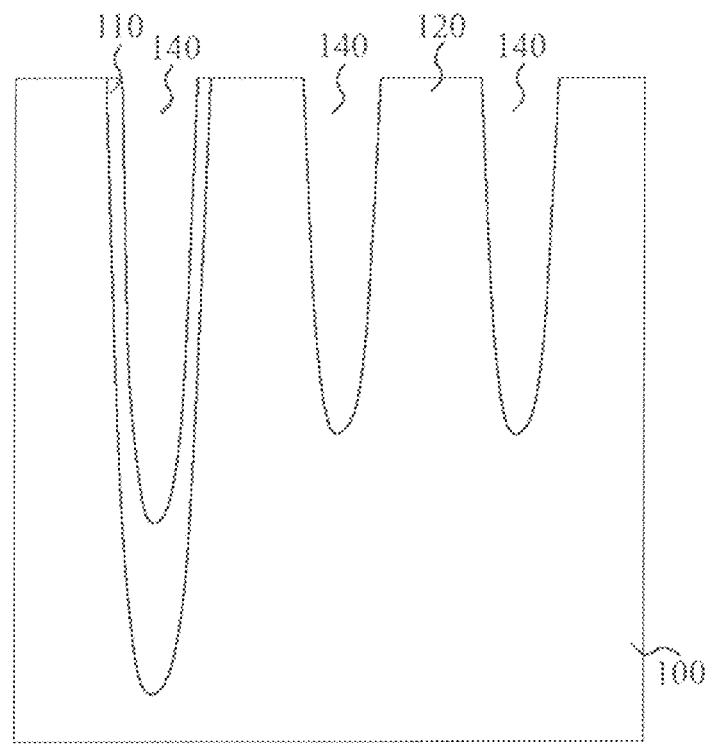

The active regions 120 and the isolation regions 110 on the substrate 100 are etched to form gate grooves 140, and the gate grooves 140 are alternately arranged with the isolation regions 110 and the active regions 120; thus, a structure shown in FIG. 8 is formed.

Figure 9:
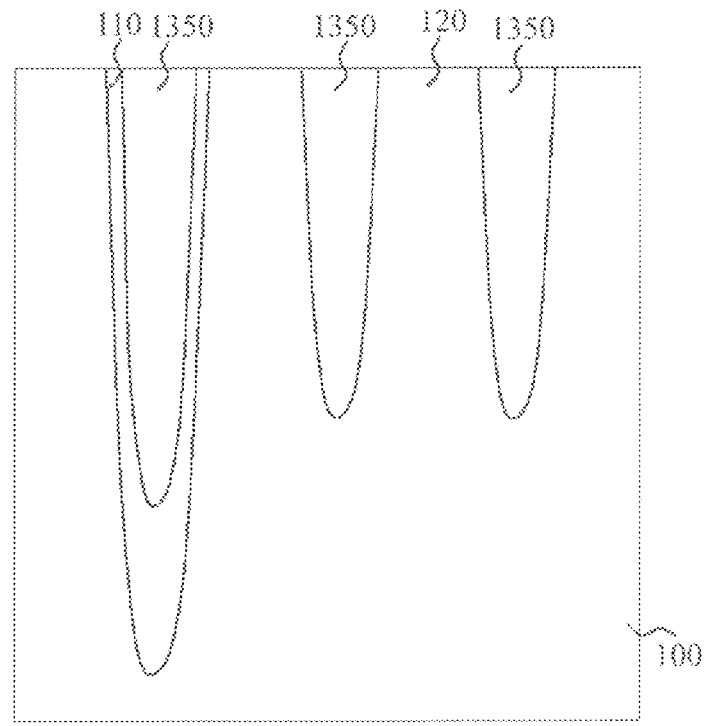
Figure 10:
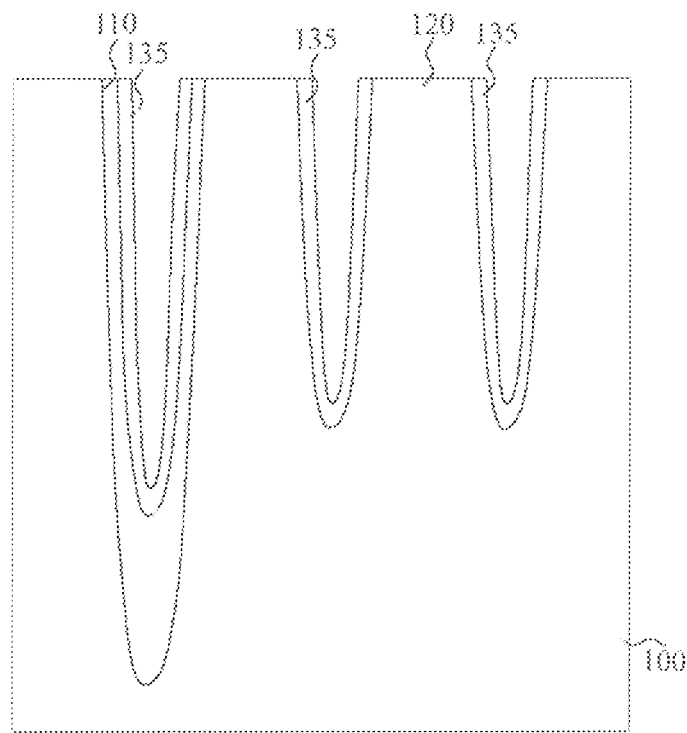

A gate dielectric layer 135 is formed on an inner surface of the gate groove 140; in an embodiment, this process step specifically includes: filling a gate dielectric material 1350 in the gate groove 140 to form a structure as shown in FIG. 9; and then etching the gate dielectric material 1350 to form the gate dielectric layer 135 on the inner surface of the gate groove 140; thus, a structure as shown in FIG. 10 is formed.

Figure 11:
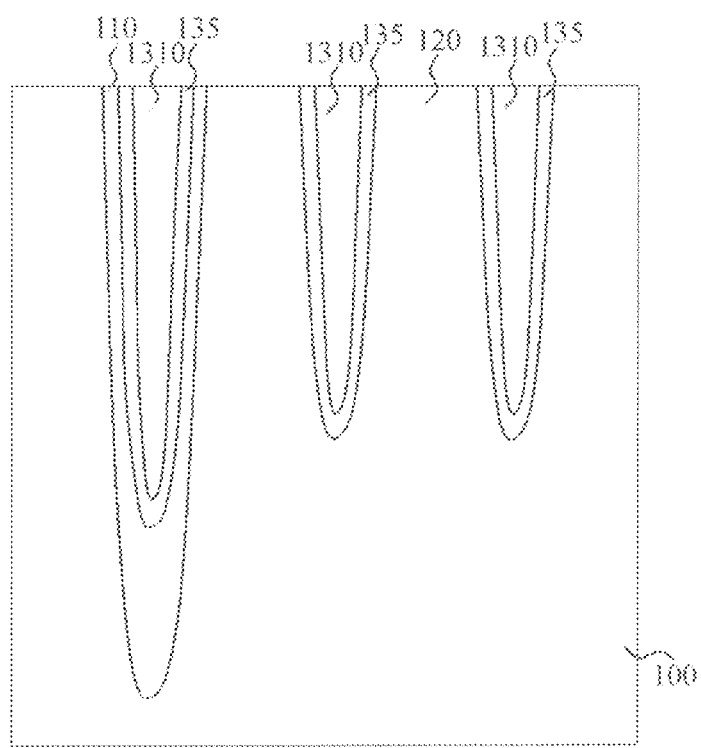
Figure 12:
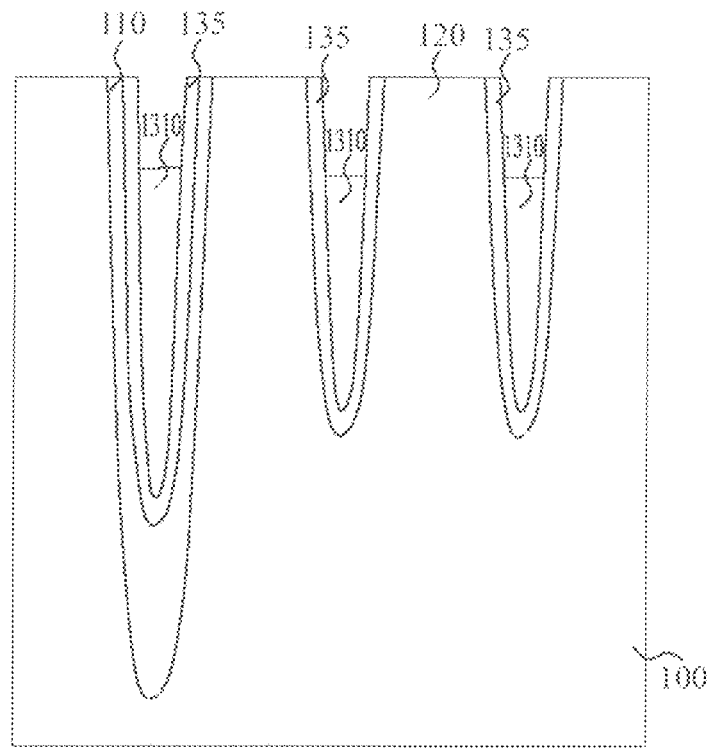
Figure 13:
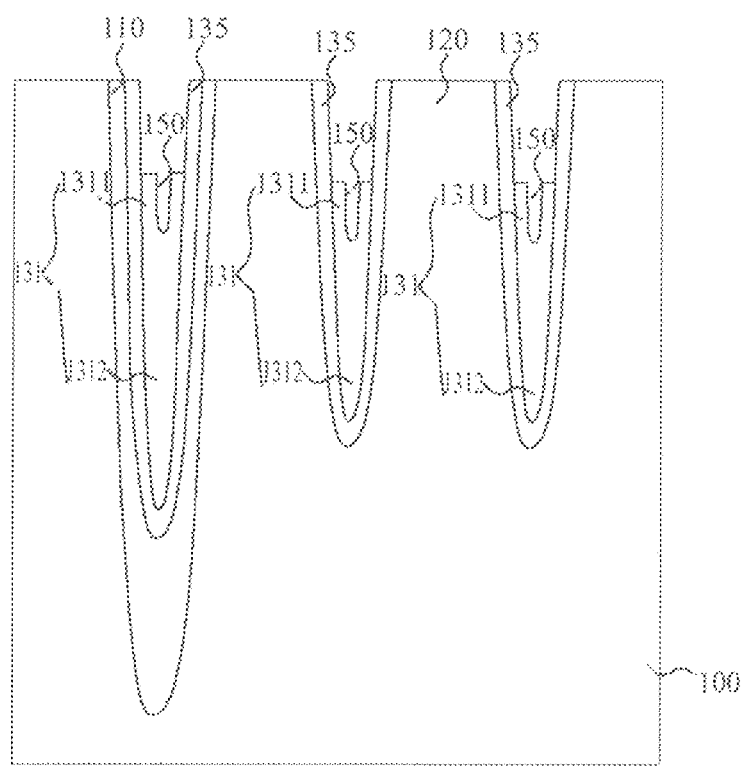

A work function layer 131 is formed on the gate dielectric layer 135 and in the gate groove 140. In an embodiment, this process step specifically includes: filling a work function material 1310 on the gate dielectric layer 135 to form a structure as shown in FIG. 11; and then etching the work function material 1310 to form a structure as shown in FIG. 12, and then further etching the work function material 1310 so that the work function layer 131 is formed on the gate dielectric layer 135 and in the gate groove 140, wherein the work function layer 131 includes a first portion 1311 of the work function layer that is lower than a top surface of the active region 120 and a second portion 1312 of the work function layer that is distributed along a direction substantially perpendicular to a bottom of the gate groove 140, and a first groove 150 is formed between the first portion 1311 of the work function layer and the second portion 1312 of the work function layer; thus, a structure as shown in FIG. 13 is formed.

Figure 14:
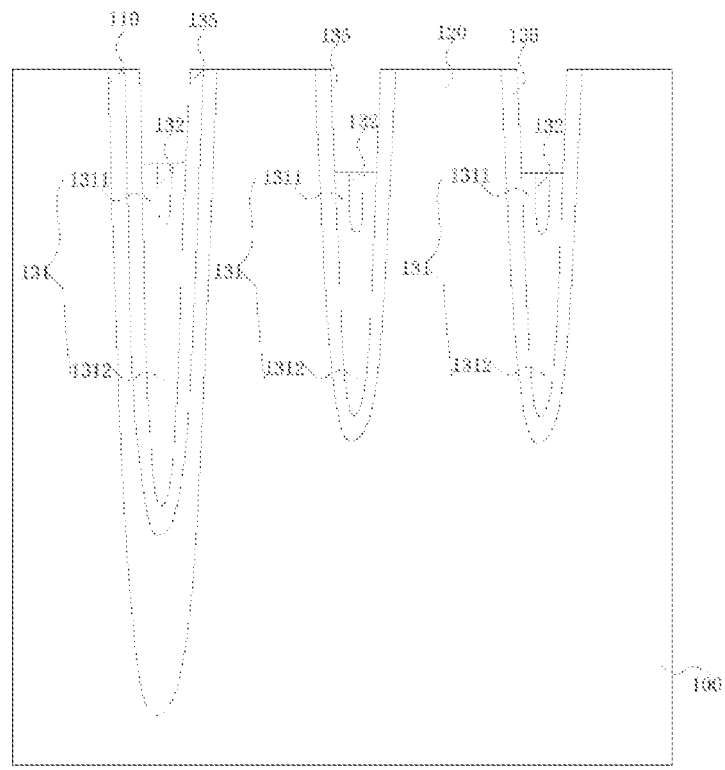

A first gate material layer 132 is formed on an inner surface of the work function layer 131, and the first gate material layer 132 fills up the first groove 150; thus, a structure as shown in FIG. 14 is formed.

Figure 15:
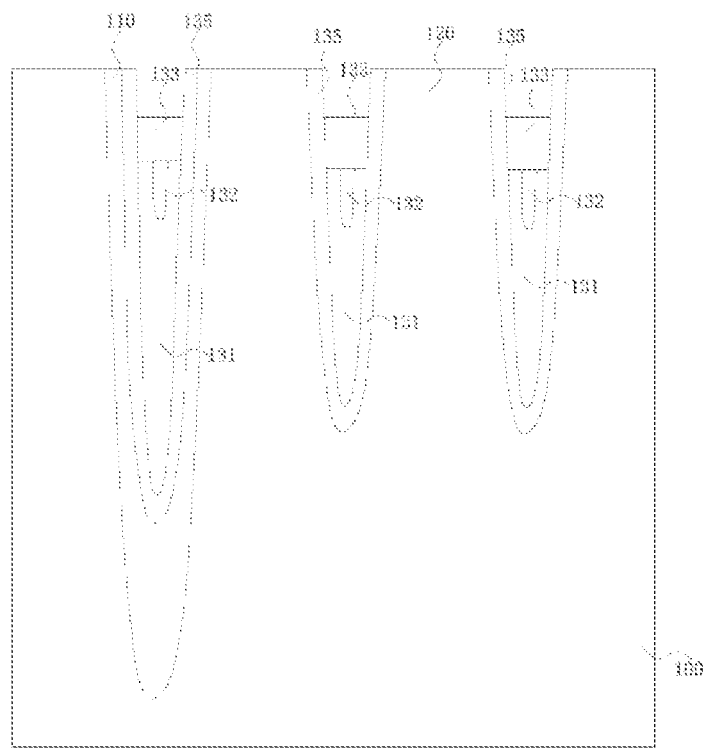

A second gate material layer 133 is formed on a top surface of the work function layer 131, a top surface of the first gate material layer 132 and a surface of the gate dielectric layer 135, and the second gate material layer 133 is lower than the top surface of the active region 120; thus a structure as shown in FIG. 15 is formed.

In an embodiment, a height ratio of the second portion 1312 of the work function layer to the first gate material layer 132 to the second gate material layer 133 is 3-8:1-1.5:1.

In an embodiment, a ratio of the thickness of the first portion 1311 of the work function layer, the thickness of the first gate material layer 132 to the width of the gate groove 140 is 1-6:1-10:15-30.

Figure 16:
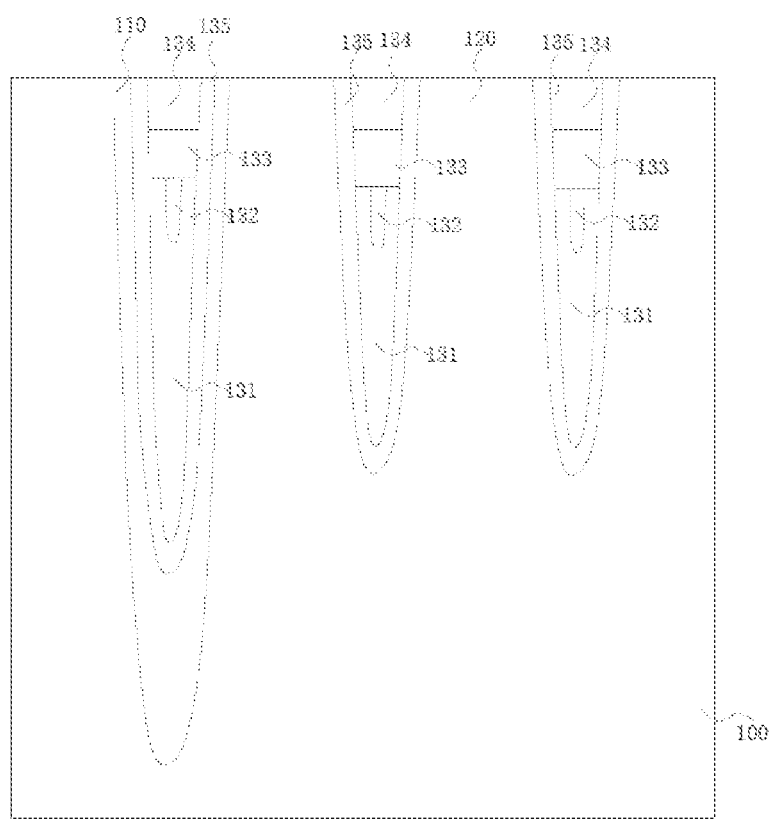

In an embodiment, a barrier layer 134 is formed on a top surface of the second gate material layer 133 and the surface of the gate dielectric layer 135, and the barrier layer 134 is at least flush with the surface of the substrate; thus, a structure as shown in FIG. 16 is formed.

In an embodiment, the gate dielectric layer 135, the work function layer 131, the first gate material layer 132, the second gate material layer 133, and the barrier layer 134 are formed by deposition, coating, printing or other existing methods. For example, they can be formed by using an SADP WL mask and a WLT (Word line trim) mask.

The etching may be one of existing etching technologies, such as patterning etching.

Embodiments of the present disclosure further discloses a memory including the semiconductor structure described in embodiments of the present disclosure.

The semiconductor structure disclosed in embodiments of the present disclosure is directed to the technical problems such as obvious reduction in the work function of the WL groove filling material layer, significant increase in the row hammer effect at the bottom of the WL groove, and obvious increase in the GIDL effect at the upper part of the WL groove, caused when the WL width is reduced. According to embodiments of the present disclosure, a height of the work function layer 131 in the WL groove filling material layer, especially a height of the second portion 1312 of the work function layer, is significantly increased, and a height of the first gate material layer 132 is significantly reduced, so that the height ratio of the second portion 1312 of the work function layer to the first gate material layer 132 to the second gate material layer 133 is maintained at 3-8:1-1.5:1; therefore, it can be ensured that the work function of the WL groove filling material layer of the recessed gate structure will be significantly increased, thereby greatly weakening the row hammer effect at the bottom of the WL groove and obviously reducing the GIDL effect at the upper part of the WL groove.

What is claimed is:

1. A semiconductor structure, comprising: a substrate; isolation regions formed in the substrate; active regions formed in the substrate and defined by the isolation regions; gate structures formed in the substrate and arranged alternately with the isolation regions and the active regions; wherein each of the gate structures comprises:

a gate groove formed in the substrate;

a gate dielectric layer formed on an inner surface of the gate groove;

a work function layer formed on the gate dielectric layer and in the gate groove, the work function layer comprising a first portion that is lower than a top surface of the active regions and a second portion that is distributed along a direction substantially perpendicular to a bottom of the gate groove, a first groove being formed between the first portion of the work function layer and the second portion of the work function layer;

a first gate material layer formed on an inner surface of the work function layer and filling up the first groove; and a second gate material layer formed on a top surface of the work function layer, a top surface of the first gate material layer and a surface of the gate dielectric layer, the second gate material layer being lower than the top surface of the active regions;

a height ratio of the second portion of the work function layer to the first gate material layer to the second gate material layer being 3-8:1-1.5:1.

2. The semiconductor structure according to claim 1, wherein a height of the second portion of the work function layer is within a range of 30 nm to 65 nm;

a height of the first gate material layer is within a range of 5 nm to 15 nm;

a height of the second gate material layer is within a range of 5 nm to 15 nm;

each of the height of the second portion of the work function layer, the height of the first gate material layer and the height of the second gate material layer is a dimension in the direction substantially perpendicular to the bottom of the gate groove.

3. The semiconductor structure according to claim 2, wherein the work function layer is configured as a titanium nitride layer, a titanium layer, a tantalum layer, or a tantalum nitride layer.

4. The semiconductor structure according to claim 3, wherein each of the gate structures further comprises a barrier layer formed on a top surface of the second gate material layer and at least flush with an upper surface of the substrate.

5. The semiconductor structure according to claim 2, wherein the first gate material layer is different from the work function layer in material and is configured as a tungsten layer, a cobalt layer, a nickel layer, a tantalum layer, a tantalum nitride layer, a titanium layer, or a titanium nitride layer.

6. The semiconductor structure according to claim 5, wherein each of the gate structures further comprises a barrier layer formed on a top surface of the second gate material layer and at least flush with an upper surface of the substrate.

7. The semiconductor structure according to claim 2, wherein a work function of the second gate material layer is less than a work function of the first gate material layer.

8. The semiconductor structure according to claim 7, wherein each of the gate structures further comprises a barrier layer formed on a top surface of the second gate material layer and at least flush with an upper surface of the substrate.

9. The semiconductor structure according to claim 2, wherein the gate dielectric layer is configured as an oxide layer, a silicon nitride layer, or a high-K gate dielectric material layer.

10. The semiconductor structure according to claim 9, wherein each of the gate structures further comprises a barrier layer formed on a top surface of the second gate material layer and at least flush with an upper surface of the substrate.

11. The semiconductor structure according to claim 2, wherein each of the gate structures further comprises a barrier layer formed on a top surface of the second gate material layer and at least flush with an upper surface of the substrate.

12. The semiconductor structure according to claim 1, wherein each of the gate structures further comprises a barrier layer formed on a top surface of the second gate material layer and at least flush with an upper surface of the substrate.

13. A memory, comprising the semiconductor structure according to claim 1.

14. A manufacturing method of a semiconductor structure, comprising:

providing an initial structure, the initial structure comprising a substrate, as well as active regions and isolation regions which are formed in the substrate, the isolation regions isolating the active regions;

etching the active regions and the isolation regions on the substrate to form gate grooves, the gate grooves being alternately arranged with the isolation regions and the active regions;

forming a gate dielectric layer on an inner surface of each of the gate grooves;

forming a work function layer on the gate dielectric layer and in each of the gate grooves, the work function layer comprising a first portion that is lower than a top surface of the active regions and a second portion that is distributed along a direction substantially perpendicular to a bottom of the gate grooves, a first groove being formed between the first portion of the work function layer and the second portion of the work function layer;

forming a first gate material layer on an inner surface of the work function layer, the first gate material layer filling up the first groove; and forming a second gate material layer on a top surface of the work function layer, a top surface of the first gate material layer and a surface of the gate dielectric layer, the second gate material layer being lower than the top surface of the active regions;

wherein a height ratio of the second portion of the work function layer to the first gate material layer to the second gate material layer is 3-8:1-1.5:1.

* * * * *